United States Patent
Xia (10) Patent No.: US 10,495,680 B2
(45) Date of Patent: Dec. 3, 2019

(54) SYSTEMS AND METHODS FOR DETECTING CURRENT TRANSFORMER ULTRASATURATION TO ENHANCE RELAY SECURITY AND DEPENDABILITY

(71) Applicant: Schweitzer Engineering Laboratories, Inc., Pullman, WA (US)

(72) Inventor: Yu Xia, Wayne, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 230 days.

(21) Appl. No.: 15/623,209

(22) Filed: Jun. 14, 2017

(65) Prior Publication Data

US 2018/0364290 A1 Dec. 20, 2018

(51) Int. Cl.
*G01R 31/02* (2006.01)
*G01R 15/18* (2006.01)

(52) U.S. Cl.
CPC .......... *G01R 31/027* (2013.01); *G01R 15/18* (2013.01)

(58) Field of Classification Search
CPC ......... H02H 3/283; H02H 3/307; H02H 1/046
See application file for complete search history.

(56) References Cited

U.S. PATENT DOCUMENTS

| | | | |
|---|---|---|---|
| 3,657,605 A | 4/1972 | Hill | |
| 3,800,893 A * | 4/1974 | Ramsay | G01G 9/00 177/25.14 |
| 3,846,675 A | 11/1974 | Shimp | |
| 4,351,011 A | 9/1982 | Liberman | |
| 4,502,086 A | 2/1985 | Ebisaka | |
| 4,731,689 A | 3/1988 | Nimmersjo | |
| 4,825,326 A | 4/1989 | Andow | |
| 4,903,163 A | 2/1990 | Atwater | |
| 5,237,511 A | 8/1993 | Caird | |
| 5,325,051 A | 6/1994 | Germer | |
| 6,011,480 A | 1/2000 | Schweitzer | |
| 6,160,697 A | 12/2000 | Edel | |
| 6,356,421 B1 | 3/2002 | Guzman-Casillas | |
| 6,411,865 B1 | 6/2002 | Qin | |
| 6,417,791 B1 | 7/2002 | Benmouyal | |
| 6,442,010 B1 | 8/2002 | Kasztenny | |

(Continued)

FOREIGN PATENT DOCUMENTS

EP 1087294 3/2001

OTHER PUBLICATIONS

Hooshyar, Ali, Majid Sanaye-Pasand, and M. Davarpanah. "Development of a new derivative-based algorithm to detect current transformer saturation." IET generation, transmission & distribution 6.3 (2012): 207-217. (Year: 2012).*

(Continued)

*Primary Examiner* — Huy Q Phan
*Assistant Examiner* — Adam S Clarke
(74) *Attorney, Agent, or Firm* — Stoel Rives, LLP (57) ABSTRACT

Methods and systems to prevent relay misoperation and enhance relay dependability during ultrasaturation is disclosed. An ultrasaturation detection system may identify an ultrasaturation condition by comparing a differential current to a first and second derivative of the differential current. When an ultrasaturation condition is determined to be present, the ultrasaturation detection system may provide parameters to a relay to prevent misoperation and enhance relay dependability.

20 Claims, 7 Drawing Sheets

(56) References Cited

U.S. PATENT DOCUMENTS

| | | | |
|---|---|---|---|
| 6,456,947 | B1 | 9/2002 | Adamiak |
| 6,518,767 | B1 | 2/2003 | Roberts |
| 6,525,543 | B1 | 2/2003 | Roberts |
| 6,590,397 | B2 | 7/2003 | Roberts |
| 6,617,839 | B2 | 9/2003 | Kang |
| 6,757,146 | B2 | 6/2004 | Benmouyal |
| 6,804,094 | B2 | 10/2004 | Kampmeyer |
| 6,804,600 | B1 | 10/2004 | Uluyol |
| 6,813,571 | B2 | 11/2004 | Lightbody |
| 7,196,884 | B2 | 3/2007 | Guzman-Casillas |
| 7,660,088 | B2 | 2/2010 | Benmouyal |
| 2002/0145841 | A1 | 10/2002 | Williams |
| 2003/0117025 | A1 | 6/2003 | Rouquette |
| 2004/0057175 | A1 | 3/2004 | Fedirchuk |
| 2005/0030693 | A1 | 2/2005 | Deak |
| 2006/0218310 | A1 | 9/2006 | Morris |
| 2007/0070565 | A1 | 3/2007 | Benmouyal |
| 2009/0147412 | A1* | 6/2009 | Kojovic ............... H02H 7/0455 361/36 |
| 2013/0181755 | A1* | 7/2013 | Li ..................... H02H 3/283 327/156 |

OTHER PUBLICATIONS

Kasztenny, Bogdan, N. Fischer, and Y. Xia. "A new inrush detection algorithm for transformer differential protection." (2014): 5-1. (Year: 2014).*

SEL-487E,-3,-4 Relay Current Differential and Voltage Protection Instruction Manual, Schweitzer Engineering Laboratories, Inc., Sections 3 and 5; Mar. 27, 2017.

B.Kasztenny, E. Rosolowski, M.Lukowicz, J.Izykowski; Current Related Relaying Algorathms Immune to Saturation of Current Transformers; Developments in Power System Protection, Mar. 25-27, 1997.

Steven Hodder, Bogdan Kasztenny, Normann Fischer, YuXia; Low Second-Harmonic Content in Transformer Inrush Currents—Analysis and Practical Solutions for Protection Security; Oct. 2013.

* cited by examiner

FIG. 7

SYSTEMS AND METHODS FOR DETECTING CURRENT TRANSFORMER ULTRASATURATION TO ENHANCE RELAY SECURITY AND DEPENDABILITY

TECHNICAL FIELD

The present disclosure relates generally to detect current transformer saturation. Specifically, the present disclosure relates to determining saturation using first and second derivatives of the current transformer secondary currents and prevent relay misoperation due to current transformer saturation.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

This disclosure describes systems and methods for detecting ultrasaturation. When implemented, the systems and methods may make fault detection logic for relays more robust. For example, some embodiments may prevent relay misoperation by detecting ultrasaturation and adjusting relay logic parameters to facilitate fault detection.

Various fault detection devices monitor differential current to detect faults. For example, a fault detection device may trip a circuit breaker when an input current to a transformer is different than an output current of a transformer. The accuracy of this method relies on a clean current signal. However, some transformers produce harmonic current due to magnetic fields generated during energization. The phenomenon jeopardizes the security of the fault detection device, because the magnetizing current may influence the primary differential current measurement. For example, as a transformer is energized, the inrush current will appear as the differential current measurement. The increase may be sufficient to cause the fault detection device to falsely identify inrush condition as a fault.

To solve this problem, transformer inrush current identification logic has been added to relays. The inrush current identification logic may detect inrush current and block or restrain the effects of inrush currents. For example, in one embodiment, a transformer inrush current identification logic may identify the shape of a secondary harmonic current to determine that there is an inrush current. Based on that determination, a relay may limit the effects of the inrush currents by blocking or restraining the relay from operating during the inrush condition.

However, the inrush current identification logic used in these relays works when the current transformers (CTs) are accurately reproducing the secondary current, which is not necessarily true. CTs, as power transformer, are also subject to ultrasaturation phenomenon. CT ultrasaturation happens when the oscillating component in the primary current is relatively low while the decaying dc component lasts for a long time. Prior to CT ultra-saturation the secondary current reproduces the offset primary current accurately for a period of time. At the moment the minimum flux reaches CT saturation level, the CT magnetizing current becomes significant. This current does not oscillate much because the AC component in the primary current is low. As a result this near-DC magnetizing current reduces the secondary current and eventually makes it near symmetrical. After some time the secondary current does not contain the decaying DC offset. This type of saturation may jeopardize differential elements.

This scenario is often encountered during remote faults near generators (due to very high source X/R ratio) and during transformer inrush (the oscillating component decays while the DC component can last for a second or longer). Because of the small amount of harmonic current and the variance in wave-shape caused by ultrasaturation may cause a relay to falsely trip or fail to detect a fault.

Disclosed herein are embodiments of methods and systems to prevent relay misoperation due to ultrasaturation. The embodiments described herein may identify ultrasaturation and alter parameters of a relay to prevent misoperation and enhance relay dependability. In some embodiments, the output of an ultrasaturation detection system may be sent to a harmonic current based differential element to facilitate accurate reproduction of a primary current.

A system to prevent relay misoperation due to ultrasaturation may comprise at least one current sensor, a communication interface and one or more processors. The at least one current sensor may determine differential current values on each phase of a three-phase transmission system. The communication interface may connect to a communication path to a relay logic circuit.

The one or more processors may detect ultrasaturation using a derivative comparison. For example, the processors may determine a first derivative and a second derivative of the differential current magnitudes. The processors may detect ultrasaturation by comparing the differential current magnitudes with the first derivative and the second derivative of the differential current values. If the first derivative and the second derivative of the differential current values have smaller magnitudes than the magnitude of the differential current, the processors may determine that an ultrasaturation condition exists.

The derivative determinations may be done via various processing methods. For example, in some embodiments, the first derivative and the second derivative of the differential current values may be determined in parallel. In some embodiments, the second derivative of the differential current values may be determined by taking the derivatives sequentially. For instance, the first derivative may be calculated and stored and the second derivative may be found using the first derivative.

To compare the derivatives, the one or more processors may sum a magnitude of the first derivative and a magnitude of the second derivative to determine an aggregate derivation magnitude. The magnitude of the differential current values may be compared to the aggregate derivation magnitude to detect ultrasaturation. The magnitude of the first derivative and the magnitude of the second derivative may be scaled by a factor to facilitate comparing the differential current values to the aggregate derivation magnitude. For example, the two derivatives may be scaled by a factor of 0.5 to average the magnitude when summed.

The processors may provide at least one control parameter to the relay logic circuit based on the detected ultrasaturation condition to prevent relay misoperation. For example, the at least one control parameter may comprise a wave-shape correction parameter to facilitate signal correction at the relay logic circuit. In some embodiments, the system may include a threshold check that prevents the one or more processors from providing the at least one control parameter when the differential current values on each phase of the three-phase transmission system is less than a threshold value.

In some embodiments, the one or more processors are further configured to adjust a sensitivity for detection of ultrasaturation of a relay based on at least one setting. For instance, the at least one setting may include a scaling factor for the differential current values, and an offset for the differential current values.

The one or more processors may be a microprocessor, FPGA, application specific integrated circuit (ASIC), or the like that may be configured to coordinate one or more desired functions (e.g., measure, compare, analyze, normalize, etc.). A processor may perform distributed (e.g., parallel) processing to execute or otherwise implement functionalities of the present embodiments. A processor may run a standard operating system and perform standard operating system functions. It is recognized that any standard operating system may be used, such as, for example, Microsoft® Windows®, Apple® MacOS®, Disk Operating System (DOS), UNIX, IRJX, Solaris, SunOS, FreeBSD, Linux®, QNX®, ffiM® OS/2® operating systems, and so forth.

As used herein, the phrases "coupled to," "communicatively coupled to," and "in communication with" are broad enough to refer to any suitable coupling or other form of interaction between two or more components, including electrically, mechanical, fluid, and thermal interaction. Two components may be coupled to each other even though there may be intermediary devices between the two components.

A "protection relay" or "relay" is a switch that can open and/or close one or more circuits electromechanically or electronically. A relay may protect distribution or transmission circuits by tripping and closing a breaker under abnormal conditions. Protective relays can prevent equipment damage by detecting electrical abnormalities, including an arc flash event, faults, unbalance conditions, overcurrent conditions, power swing conditions, and the like.

An intelligent electronic device (IED), which may be used for monitoring, protecting, and/or controlling industrial and utility equipment, such as in electric power delivery systems may include system components to implement a method for identifying an ultrasaturation condition. As used herein, an IED may refer to any one or combination of a central processing unit (CPU)-based relay and/or protective relay, a communication processor, a digital fault recorder, a phasor measurement unit (PMU), a phasor measurement and control unit (PMCU), a phasor data concentrator (PDC), a wide area control system (WACS), a relay with phasor measurement capabilities, a wide area protection system (WAPS), a Supervisory Control and Data Acquisition (SCADA) system, a system integrity protection scheme, or any other device capable of monitoring and/or protecting an electrical power system. The term "IED" may be used interchangeably to describe an individual IED or a system comprising multiple IEDs.

One embodiment of a detection system may be included on an IED with a CPU coupled to a random access memory (RAM), a read only memory (ROM), a display, a user input, a modulator/demodulator (MODEM), and/or a storage medium interface. The CPU may be a microprocessor such as a reduced instruction set computer (RISC) or complex instruction set computer (CISC). The ROM may store program instructions to be executed by the CPU. The RAM may store data to be processed by the CPU and program registers. The MODEM may be coupled to a communications link and enable the CPU to receive and transmit data to and from another processor. The MODEM may be coupled to a local area network (LAN), an Internet, or another communications link. The storage medium interface may enable data transfers between the CPU and a storage medium. The storage medium interface may be any interface that enables communication between the CPU and a storage medium, such as small computer system interface (SCSI), industry standard architecture (ISA), peripheral component interconnect (PCI), and others. The CPU may receive data including database records from a storage medium coupled to the storage medium interface or via the MODEM from almost any location.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that perform one or more tasks or implement particular abstract data types. A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

In some embodiments, an ultrasaturation detection system may couple to a human machine interface (HMI), which may include a display, an attached computer, or the like. The HMI may include one or more input/output interfaces that facilitate human machine interaction. The input device(s) may include a keyboard, mouse, button, touch screen, light pen, tablet, microphone, sensor, or other hardware with accompanying firmware and/or software. The output device(s) may include a monitor or other display, printer, speech or text synthesizer, switch, signal line, graphical user interface, or other hardware with accompanying firmware and/or software. A display may enable the CPU to display data or information to a user in a human-readable format. The display may be any display device including a light emitting diode (LED), liquid crystal display (LCD), and others. The user may provide an input to the CPU to perform operations on database records, including sorting a group of records based on one or more fields where the fields of the records are to be sorted.

Any "communications network" or "network" disclosed herein may include a wide variety of network infrastructures. In some embodiments, a network is formed by coupling several nodes on an FPGA board. In other embodiments, the network may couple remote devices. Specifically, a network may incorporate landlines, wireless communication, optical connections, various modulators, demodulators, small form-factor pluggable (SFP) transceivers, routers, hubs, switches, and/or other networking equipment. The network may include communications or networking software, such as software available from Novell, Microsoft, Artisoft, and other vendors, and may operate using TCP/IP, SPX, IPX, SONET, and other protocols over twisted pair cables, coaxial cables, optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. According to one embodiment, a database management system (DBMS) allows users to interact with one or more databases and provides access to the data contained in the databases.

An ultrasaturation detection system may comprise one or more modules. A module may include all or portions of other elements of the system. The modules may run multiple operations concurrently or in parallel by or on one or more processors. Portions of the disclosed modules, components, and/or facilities are embodied as executable instructions embodied in hardware or firmware, or stored on a non-transitory, machine-readable storage medium. The instructions may comprise computer program code that, when executed by a processor and/or computing device, causes a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. Portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

Figure 1:
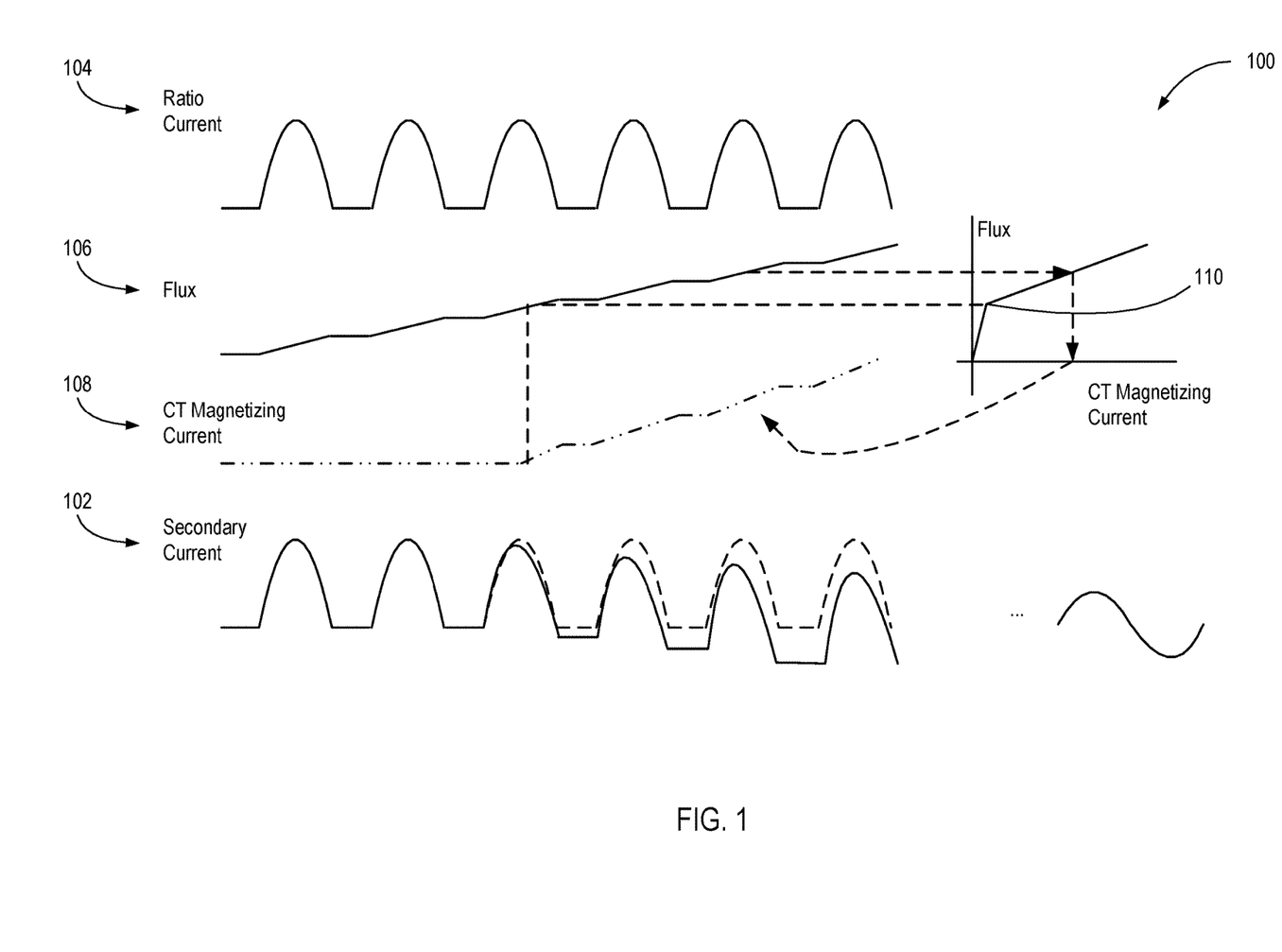
FIG. 1 illustrates an ultrasaturation condition on a current transformer due to inrush current.

FIG. 1 illustrates an ultrasaturation condition 100 on a CT due to inrush current. As shown, ultrasaturation may alter the shape of a secondary current 102. The change in shape of the secondary current 102 may cause a differential element to inaccurately reproduce the primary current, resulting in possible relay misoperation.

During an inrush current period, a ratio current 104 interacts with a CT burden resistance and generates a magnetizing voltage for the CT core. The integral of this voltage becomes a core's flux 106. Because the current is uni-polar the flux 106 increases during the intrusion current period. As the flux 106 increases, the CT core draws a larger and larger magnetizing current 108. The magnetizing current 108 reduces harmonic currents corresponding to the ratio current 104. For example, as shown, as the flux 106 increases, the secondary current 102 is shifted lower. Eventually when the CT is in an ultrasaturation 110 the secondary current 102 waveform becomes near symmetrical.

Prior to the CT ultrasaturation 110 the secondary current 102 reproduces the ratio current 104 accurately for a period of time. At the moment the flux 106 reaches CT saturation level, the CT magnetizing current 108 becomes significant. This current does not oscillate much because the AC component in the primary current is low. As a result this near-DC magnetizing current reduces the secondary current 102 and eventually makes it near symmetrical. After some time the secondary current 102 does not contain the decaying DC offset. This type of saturation may jeopardize generator, bus and line differential relays.

Figure 2:
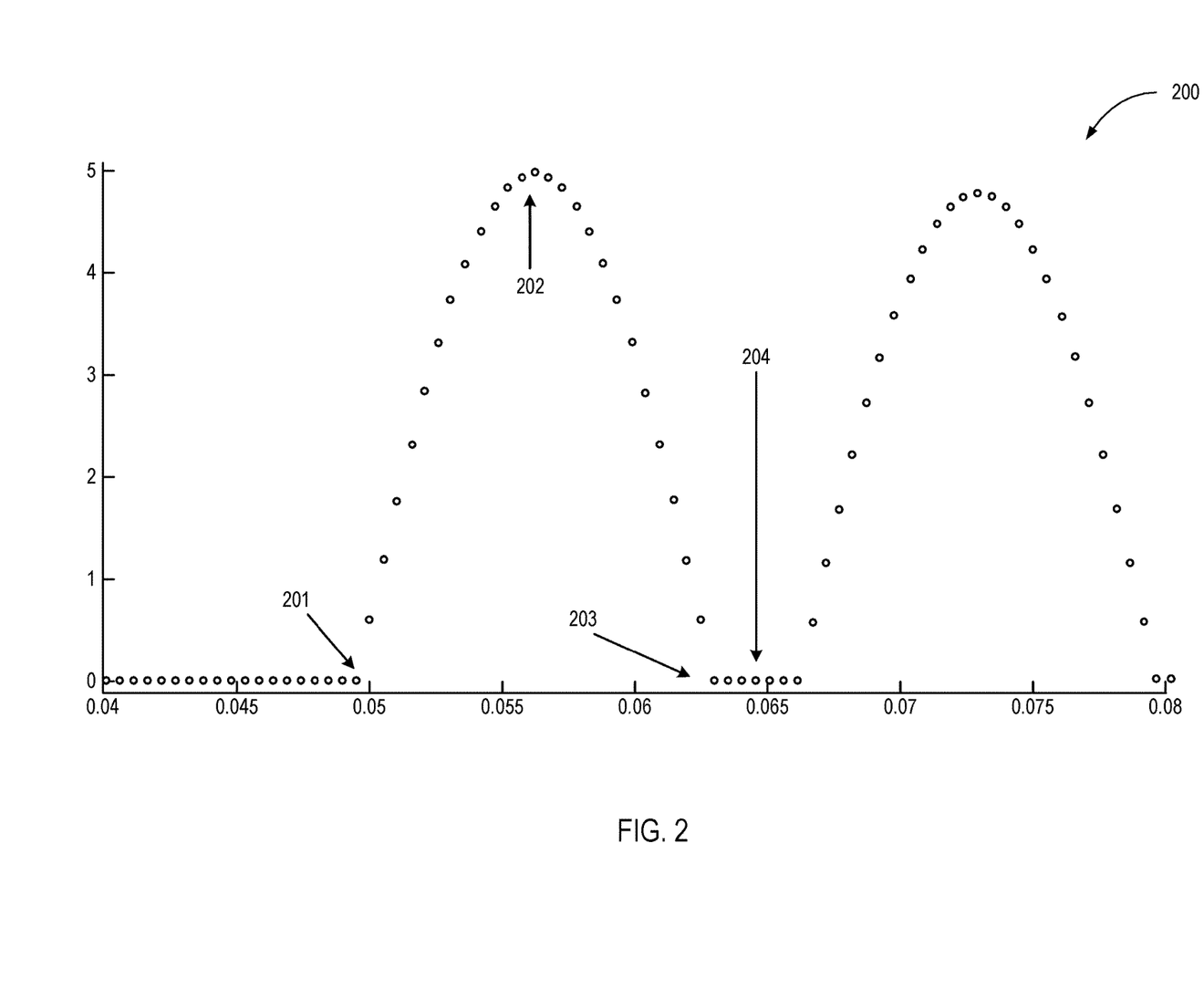
FIG. 2 illustrates an example of a current waveform that may be measured at a current transformer.

FIG. 2 illustrates an example of a current waveform 200 that may be measured at a CT. At different points (e.g., points 201-204) along the current waveform 200 the instantaneous value may be compared with a first and second derivative value to determine an ultrasaturation condition. Below, Table 1 compares an instantaneous value, a first derivative value, and a second derivative value with respect to points along the current waveform 200.

TABLE 1

| Point along current waveform | Instantaneous | First derivative | Second derivative |
| --- | --- | --- | --- |
| 201 | Small | Large | Small |
| 202 | Large | Small | Large |
| 203 | Small | Large | Small |
| 204 | Small without saturation and large with saturation | Small | Small |

As shown in Table 1, the summation of an instantaneous value and a first derivative is large at each point except a flat point 204 when not saturated. Current waveshape based logic may utilize this relationship between the instantaneous value and first derivative to identify the flat point 204. For example, at transition points 201 and 203 the instantaneous value is small while the first derivative is large. Thus, at transition points the summation of the instantaneous value and the first derivative is large. Inversely, at a peak point 202, the instantaneous value is large while the first derivative is small. The summation at the peak point 202 is large just as at the transition point. At the flat point 204 with no saturation, the instantaneous value is small and, since there is little change in the waveform, the first derivative is small as well.

However, with ultrasaturation, the summation of the instantaneous value and the first derivative is large at the flat point 204, causing current waveshape based logic to fail to identify the flat point 204. However, if the second derivative is also compared with the first derivative, the flat point 204 may be identified during ultrasaturation as the summation of first and second derivatives remains small even during ultrasaturation. Thus, ultrasaturation of a CT may be detected when the instantaneous value is large while the first and second derivatives are small.

Figure 3:
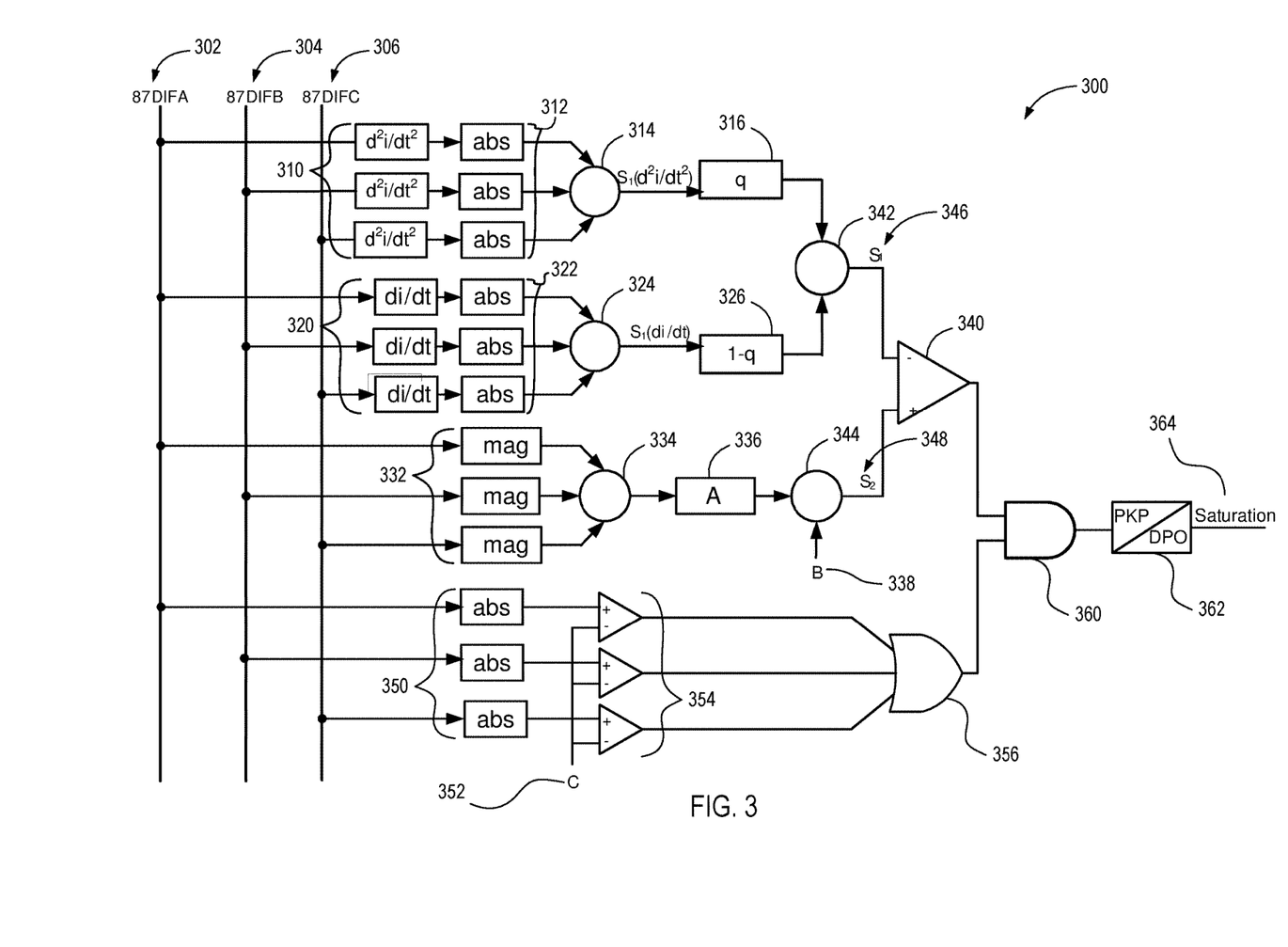
FIG. 3 is a block diagram of an ultrasaturation detection system, according to one embodiment.

FIG. 3 is a block diagram of an ultrasaturation detection system 300, according to one embodiment. The ultrasaturation detection system 300 may receive a differential current for each phase (e.g., a phase A 302, a phase B 304, a phase C 306) of a three phase system. The ultrasaturation detection system 300 may use an instantaneous value of the differential current, the first derivative of the differential current, and the second derivative of the differential current to determine if there is an ultrasaturation event, and output a signal to indicate the ultrasaturation event.

To calculate the first and second derivatives of the differential current, the ultrasaturation detection system 300 may comprise two sets of differentiators (e.g., a first order differentiator set 320, and a second order differentiator set 310). The first order differentiator set 320 may receive as an input the differential current and output a derivative of the differential current. Similarly the second order differentiator set 310 may receive as an input the differential current and output a second derivative of the differential current. In some embodiments, the ultrasaturation detection system 300 may use two first order differentiator sets in series to find the first and the second derivatives.

The output of the differentiators is an input for two sets of wave rectifiers (e.g., a first wave rectifier 322, and a second wave rectifier 312). The first and second wave rectifiers 312, 322 receive the first and second derivatives, and output an absolute value signal for each phase. The first derivative absolute value signal of each phase is added using a first summer 324. Similarly the second derivative absolute value signal of each phase is added using a second summer 314.

Two multiplying modules 316, and 326 scale the derivative summations. The scaling factors (e.g., q and 1-q) may facilitate comparing an operating signal (S1) 346 to a restraint signal (S2) 348. The scaling factors may be adjusted to increase or decrease the effect of the first or second derivatives on the ultrasaturation determination. For example, in some embodiments, the scaling factors may be both set to 0.5.

A third summer 342 may sum the scaled outputs of both the first and the second derivative lines. The output of the third summer 342 is the aggregate of the first and second derivation magnitude or the operating signal (S1) 346. A comparator 340 compares the operating signal (S1) 346 to the restraint signal (S2) 348 to determine if an ultrasaturation condition is occurring. The restraint signal (S2) 348 is calculated by adding the magnitude of differential current for each phase (e.g., the phase A 302, the phase B 304, the phase C 306) using a plurality of magnitude modules 332 and a fourth summer 334.

The comparator 340 compares the operating signal (S1) 346 to the restraint signal (S2) 348. Thus, the comparator 340 compares the first and second derivatives to the magnitude of the differential current values. The comparator 340 outputs a signal indicating ultrasaturation if the first derivative and the second derivative have smaller magnitudes than the magnitude of the differential current values. For example, if the slope of the differential current and the rate of change of the slope are small and the magnitude of the differential current is greater than the slope and the rate of change of the slope, an ultrasaturation condition may be detected.

The restraint signal (S2) 348 may be modified using parameters A 336 and B 338. The parameters may have default values. In some embodiments, the parameters may be set to a value within a defined range. For example, a user may adjust the parameters A 336 and B 338 to increase security or increase dependability of a relay. Security, in this example, refers to reducing the number of non-fault conditions that cause a relay to trip. Dependability, in this example, refers to increasing the sensitivity to detect fault conditions. For example, a user may set the parameters A 336 to a low value to increase dependability. However, lowering A 336 would decrease the system's security. Conversely, if A 336 is increased, the ultrasaturation detection system 300 would become more sensitive to detecting an ultrasaturation condition.

An AND gate 360 may receive the output of the comparator 340 and a threshold signal. The threshold signal indicates whether there is sufficient differential current for a meaningful comparison by the comparator 354. The threshold signal may be generated by determining the absolute value of the differential currents on each of the three phases using an absolute value module 350. The absolute value of the differential currents is the compared, via comparators 340, to a setpoint 352. If any phase has a differential current above the setpoint 352 then an OR gate 356 outputs the threshold signal to the AND gate 360.

The output of the AND gate 360 indicates whether there is an ultrasaturation condition or not. If an ultrasaturation condition is present, a pickup signal/drop out signal 364 may be sent to relay logic via a communication interface. The communication interface may be configured to communicate with relay logic and provide correction parameter to the relay logic to prevent misoperation. For example, the correction parameter may include a wave-shape correction parameter to facilitate signal correction of the secondary current at the relay logic circuit. In some embodiments, the correction parameter may block the relay from operation during an ultrasaturation condition.

Figure 4:
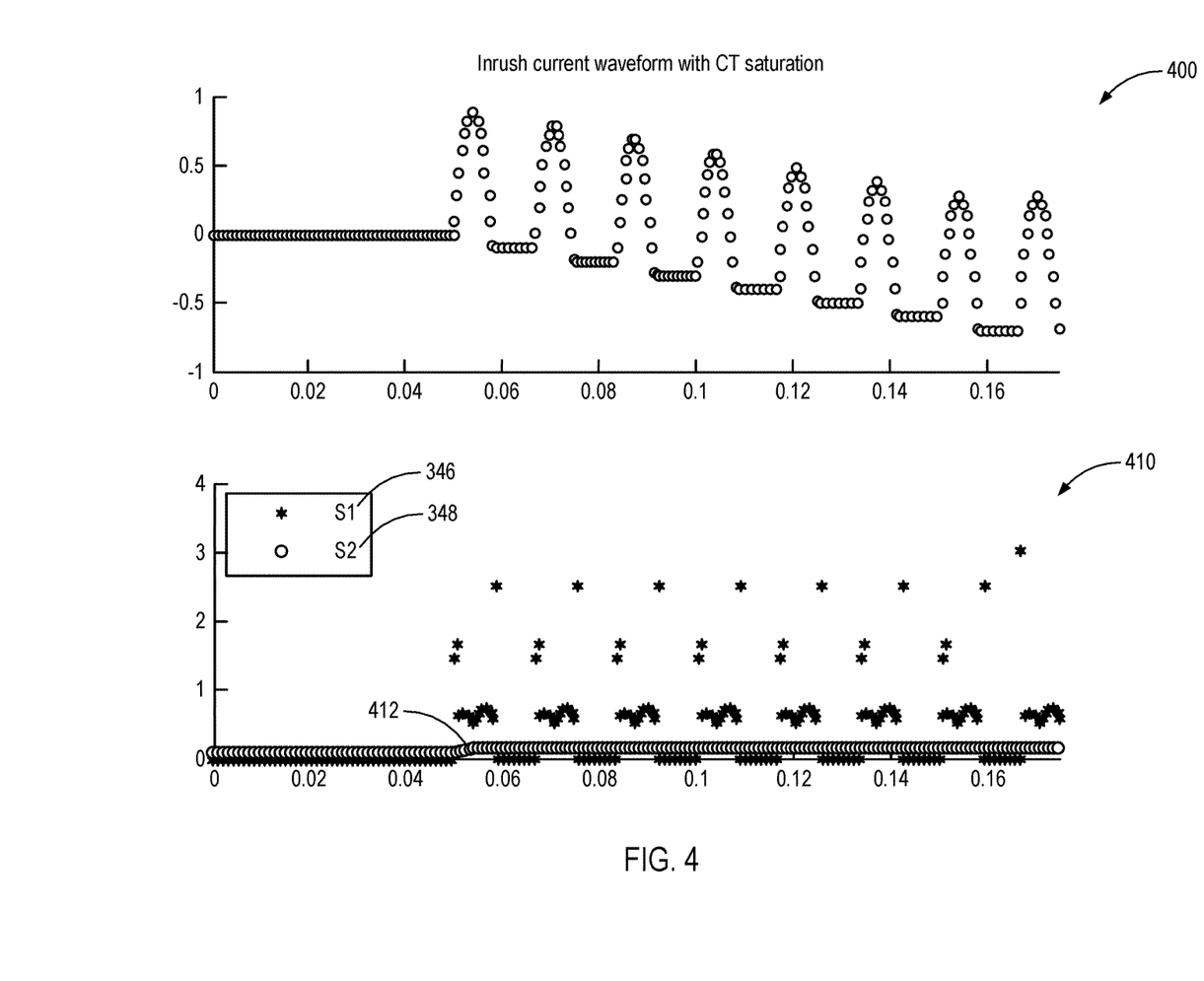
FIG. 4 illustrates a graph depicting operating signal and a restraint signal of an ultrasaturation detection system during a current inrush condition, according to one embodiment.

FIG. 4 illustrates a graph 410 depicting the operating signal (S1) 346 and the restraint signal (S2) 348 of an ultrasaturation detection system during a current inrush condition, according to one embodiment. As shown, the inrush condition may cause a differential current 400 to lower. In some cases of ultrasaturation, the inrush condition may become more symmetrical about the x-axis.

Initially in FIG. 4, the operating signal (S1) 346 and the restraint signal (S2) 348 are equal or closely similar at or near zero Amps. As shown, at a saturation point 412 the restraint signal (S2) 348 increases and the operating signal (S1) 346 periodically falls below the increased restraint signal (S2) 348. Because the operating signal (S1) 346 falls below the restraint signal (S2) 348, an ultrasaturation detection system may detect ultrasaturation. With this information, transformer and generator protection can be made more dependable and secure.

Figure 5:
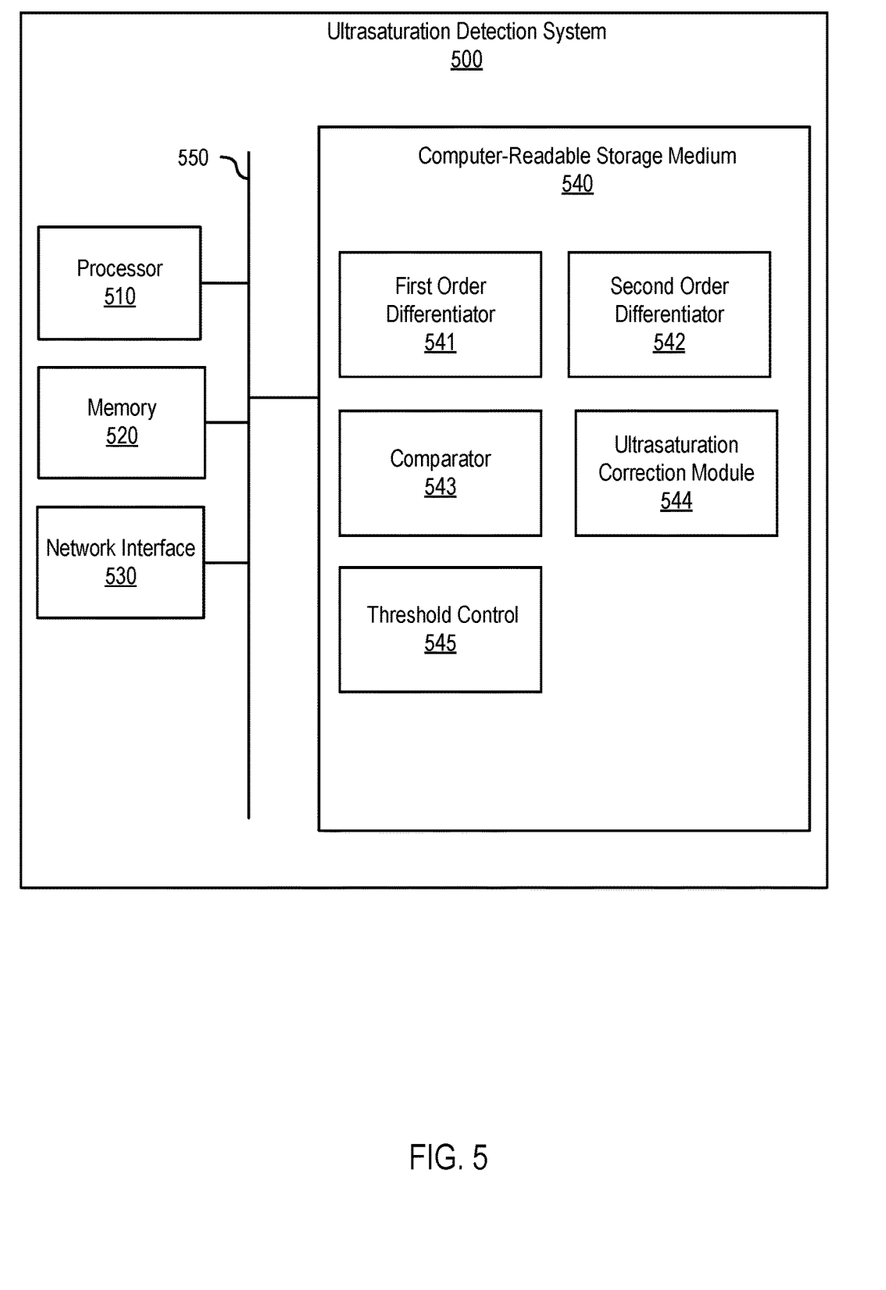
FIG. 5 is a functional block diagram of an ultrasaturation detection system, according to one embodiment.

FIG. 5 is a functional block diagram of an ultrasaturation detection system 500, according to one embodiment. The ultrasaturation detection system 500 may be implemented on an FPGA or general computing device that may be programmed using any one of many hardware description languages for digital circuit design.

The ultrasaturation detection system 500 may be an IED or other computing system and include a processor 510, a memory 520, a network interface 530, and a computer-readable storage medium 540. A bus 550 may connect the processor 510 to the computer-readable storage medium 540, the memory 520, and the network interface 530.

The memory 520 and the computer-readable storage medium 540 may be any piece of hardware capable of storing information such as data, computer programs, and/or other suitable information. The memory 520 may include volatile memory and/or non-volatile memory, and may be fixed or removable. The memory 520 may include RAM, ROM, a hard drive, a flash memory, a thumb drive, an optical disk, a magnetic tape, or some combination of the above. In one embodiment, the memory 520 may be used to store instructions to be executed by the processor 510.

The computer-readable storage medium 540 may be a non-transitory memory device, according to one embodiment, and include any number of modules 541-545 for detecting an ultrasaturation condition. In some embodiments, one or more of the modules 541-545 may be implemented in hardware and/or firmware instead of software. In some embodiments, one or more of the modules 541-545 may be implemented in a cloud-based or remote location and interface via a communication interface, such as the network interface 530.

The computer-readable storage medium 540 may include a first order differentiator 541 that receives a differential current and determines the derivative of the differential current. Further, a second order differentiator 542 receives a differential current and determines the second derivative of the differential current. A comparator 543 may compare a magnitude of the derivatives and a magnitude of the differential current. Based on the comparison, an ultrasaturation correction module 544 may determine relay parameters to reduce the effects of the ultrasaturation condition. For example, the ultrasaturation correction module 544 may generate parameters to correct the differential waveform. For instance, the parameter may raise the differential current to facilitate accurate reproduction of a primary current. A threshold control 545 may prevent the network interface 530 from transmitting a correction parameter from the ultrasaturation correction module 544 if the differential current is below a setpoint. This prevents the ultrasaturation detection system 500 from producing false-positives.

Figure 6:
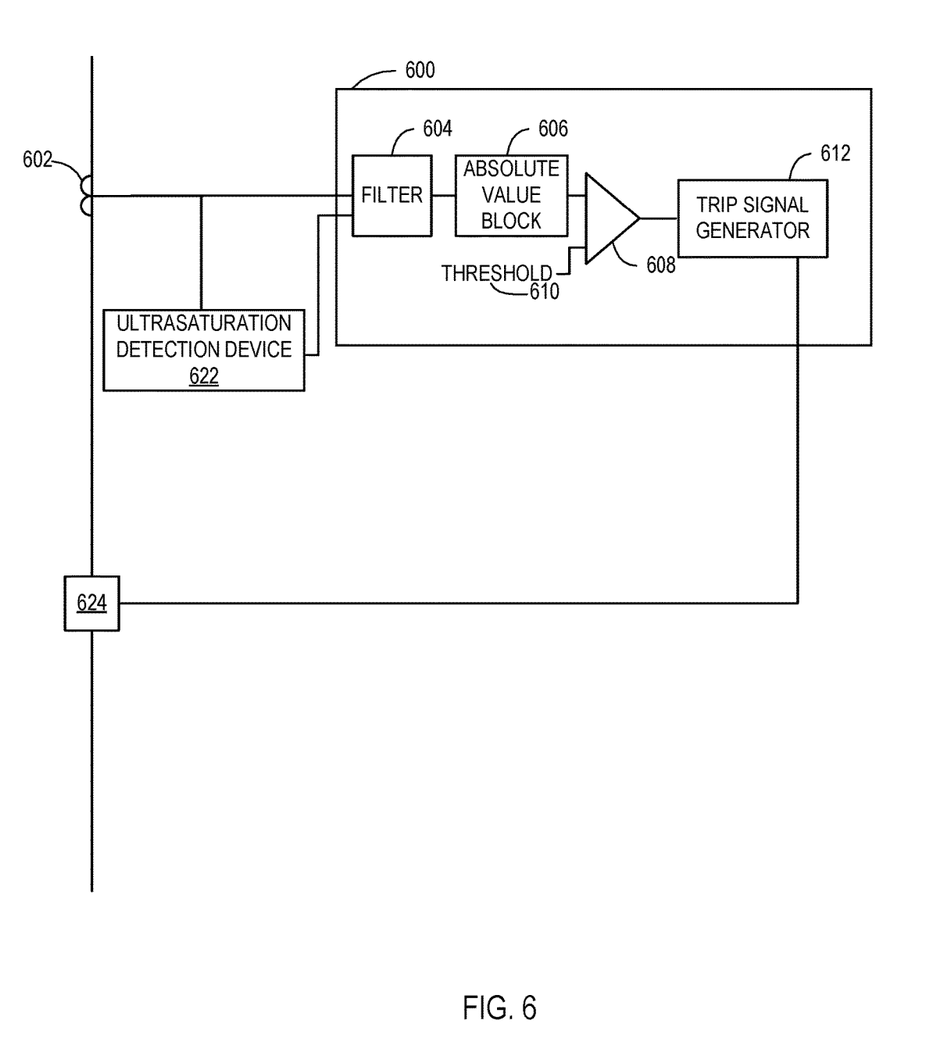
FIG. 6 is a functional block diagram of an IED using an ultrasaturation detection device, according to one embodiment.

FIG. 6 is a functional block diagram of an IED 600 using an ultrasaturation detection device 622, according to one embodiment. As shown, in some embodiments, the ultrasaturation detection device 622 may be separate from the IED 600. Conversely, in some embodiments, the IED 600 may comprise an integrated ultrasaturation detection device 622. In one embodiment the IED 600 may be a digital relay that may identify an abnormality in current for a three-phase system and emit a trip signal.

According to one embodiment, a current transformer (CT) 602 may isolate a current signal for measurement. The current signal may be sent to the IED 600, which may comprise a filter 604 to convert the current measurement into a discrete value using an A/D converter (not shown). The ultrasaturation detection device 622 may also receive the current. The ultrasaturation detection device 622 may compare the magnitude of the current and determine a first and second derivative of the current. If the magnitude of the derivatives is smaller than the magnitude of the current, the ultrasaturation detection device 622 may send an ultrasaturation signal to the IED 600. For example, as shown the ultrasaturation detection device 622 may send an ultrasaturation signal to the filter 604. The ultrasaturation signal may notify the IED 600 of an ultrasaturation condition, provide a control parameter (e.g., a relay bock signal), and/or a wave correction parameter.

The filtered current measurement values may then flow to an absolute value block 606 to generate an absolute value of the digital current measurements by rectifying the values. The rectified values may flow to a comparator 608, which may compare the measurements to a threshold 610. If the current values exceed the threshold 610, then a signal is sent to a trip signal generator 612. The trip signal generator 612 may release a signal to a circuit breaker 624 to trip based on the output from the trip signal generator 612.

Figure 7:
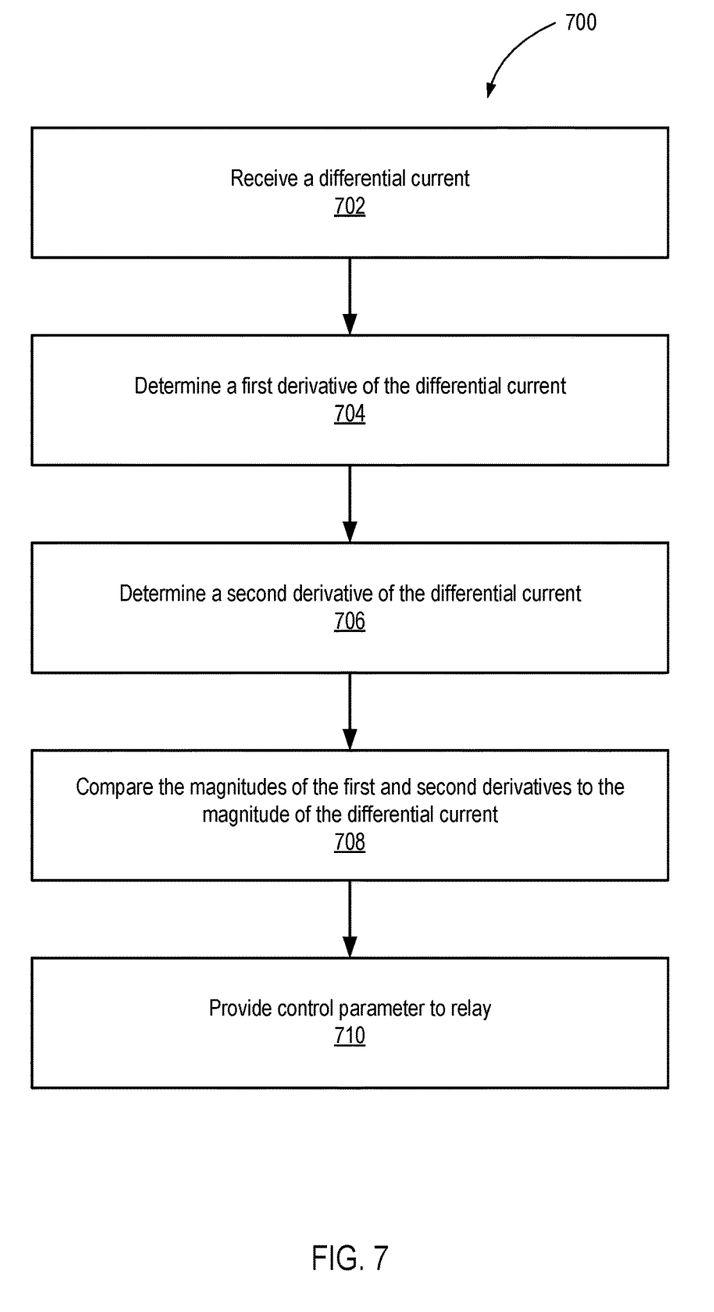
FIG. 7 is a flow chart of a method for preventing relay misoperation due to ultrasaturation, according to one embodiment.

FIG. 7 is a flow chart of a method 700 for preventing relay misoperation due to ultrasaturation, according to one embodiment. An ultrasaturation correction system may receive 702 a differential current associated with each phase of a three-phase transmission system. A set of differentiators may determine 704 a first derivative of the differential current. A second set of differentiators may determine 706 a second derivative of the differential current.

The ultrasaturation correction system may detect ultrasaturation by comparing 708 the differential current with the first derivative and the second derivative of the differential current. An ultrasaturation condition may be detected when the first derivative and the second derivative of the differential current have smaller magnitudes than a magnitude of the differential current. Based on the detected ultrasaturation condition, the ultrasaturation correction system may provide 710 one or more control parameters to a relay to reduce the effect of the ultrasaturation condition.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified.

The embodiments disclosed herein may be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the embodiments and methods of the disclosure are not intended to limit the scope of the disclosure, as claimed, but are merely representative of possible embodiments of the disclosure. In addition, the steps of a method do not necessarily need to be executed in any specific order, or even sequentially, nor need the steps be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic and/or processor executable instructions.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment.

This disclosure includes all permutations of the independent claims with their dependent claims.

It will be understood by those having skill in the art that changes may be made to the details of the above-described embodiments without departing from the underlying principles of the invention. Embodiments of the invention in which an exclusive property or privilege is claimed are defined as follows.

What is claimed is:

1. A system to prevent relay misoperation due to ultrasaturation, the system comprising:
    at least one current sensor to determine differential current values on each phase of a three-phase transmission system; a communication interface to connect to a communication
    path to a relay logic circuit;
    and one or more processors to:
        determine a first derivative of the differential current values, determine
        a second derivative of the differential current values,
        detect ultrasaturation by comparing the differential current values with the first derivative and the second derivative of the differential current values, wherein ultrasaturation is detected when the first derivative and the second derivative of the differential current values have smaller magnitudes than a magnitude of the differential current values, and provide at least one control parameter to the relay logic circuit based on detected ultrasaturation to prevent relay misoperation.

2. The system of claim 1, wherein the at least one control parameter comprises a wave-shape correction parameter to facilitate signal correction at the relay logic circuit.

3. The system of claim 1, further comprising a threshold check, wherein the threshold check prevents the one or more processors from providing the at least one control parameter when the differential current values on each phase of the three-phase transmission system is less than a threshold value.

4. The system of claim 1, wherein the one or more processors are further to sum a magnitude of the first derivative and a magnitude of the second derivative to determine an aggregate derivation magnitude, and wherein the magnitude of the differential current values is compared to the aggregate derivation magnitude to detect ultrasaturation.

5. The system of claim 4, wherein the magnitude of the first derivative and the magnitude of the second derivative are scaled by a factor to facilitate comparing the differential current values to the aggregate derivation magnitude.

6. The system of claim 1, wherein the one or more processors are further to adjust a sensitivity for detection of ultrasaturation based on at least one setting.

7. The system of claim 6, wherein the at least one setting comprises a scaling factor for the differential current values.

8. The system of claim 6, wherein the at least one setting comprises an offset for the differential current values.

9. The system of claim 1, wherein the first derivative and the second derivative of the differential current values are determined in parallel.

10. The system of claim 1, wherein the second derivative of the differential current values is determined using the first derivative of the differential current values.

11. An intelligent electronic device (IED) configured to identify a failure in an analog to digital (A/D) converter, comprising:
    a current monitor to determine a differential current, c(t), on each phase of a three-phase transmission system; a first differentiator to determine a slope of the differential current, c'(t), on
    each phase of the three-phase transmission system;
    a second differentiator to determine a rate of change of the slope, c"(t), of the differential current, c(t), on each phase of the three-phase transmission system; a comparator coupled
    to the current monitor, the first differentiator, and the second differentiator, wherein the comparator outputs a signal indicating a low secondary current when the slope of the differential current, c'(t), and the rate of change of the slope, c"(t), have smaller magnitudes than a magnitude of the differential current values; and
    a communication interface
    to connect to a communication path to a relay logic circuit to provide at least one control parameter to the relay logic circuit based on the signal output from the comparator to prevent relay misoperation due to low secondary current.

12. The IED of claim 11, wherein the at least one control parameter comprises a wave-shape correction parameter to facilitate signal correction at the relay logic circuit.

13. The IED of claim 11, further comprising a threshold check, wherein the threshold check prevents the communication interface from providing the at least one control parameter when the differential current on each phase of the three-phase transmission system is less than a threshold value.

14. The IED of claim 11, further comprising an adder to sum a magnitude of the slope of the differential current, c'(t), and the rate of change of the slope, c"(t), to determine an aggregate derivation magnitude, wherein the comparator compares the magnitude of the differential current to the aggregate derivation magnitude to detect ultrasaturation.

15. The IED of claim 14, wherein the magnitude of the slope of the differential current, c'(t), and the rate of change of the slope, c"(t), are scaled by a factor to facilitate comparing the differential current to the aggregate derivation magnitude.

16. A method to prevent relay misoperation due to ultrasaturation, the method comprising:
    receiving a differential current associated with each phase of a three-phase transmission system; determining a first derivative of the differential current;
    determining a second derivative of the differential current;
    detecting ultrasaturation by comparing the differential current with the first derivative and the second derivative of the differential current, wherein ultrasaturation is detected when the first derivative and the second derivative of the differential current have smaller magnitudes than a magnitude of the differential current;
    provide at least one control parameter to a relay logic circuit based on the detected
ultrasaturation to prevent relay misoperation.

17. The method of claim 16, further comprising receiving at least one setting to adjust a sensitivity for detecting ultrasaturation.

18. The method of claim 17, wherein the at least one setting comprises a scaling factor for the differential current values.

19. The method of claim 17, wherein the at least one setting comprises an offset for the differential current values.

20. The method of claim 16, wherein the first derivative and the second derivative of the differential current values are determined in parallel.

\* \* \* \* \*